US008710538B2

(12) United States Patent
Hwang et al.

(10) Patent No.: US 8,710,538 B2
(45) Date of Patent: Apr. 29, 2014

(54) LIGHT-EMITTING DEVICE WITH A SPACER AT BOTTOM SURFACE

(75) Inventors: Yi Feng Hwang, Penang (MY); Yin Har Cheow, Penang (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/253,636

(22) Filed: Oct. 5, 2011

(65) Prior Publication Data

US 2013/0087812 A1 Apr. 11, 2013

(51) Int. Cl.
*H01L 33/00* (2010.01)

(52) U.S. Cl.
USPC .......... 257/99; 257/88; 257/98; 257/100; 257/675; 257/669; 257/402; 257/E21.409; 257/E29.242; 257/E21.634; 257/E29.266; 438/289; 438/300; 438/303; 438/151

(58) Field of Classification Search
USPC ......... 257/88, 98, 99, 100, 675, 669; 361/679
IPC ....................................................... H01L 33/00
See application file for complete search history.

(56) References Cited

U.S. PATENT DOCUMENTS

| 6,084,252 A * | 7/2000 | Isokawa et al. ............. 257/98 |
| 6,305,825 B1 | 10/2001 | Okubo |
| 6,834,977 B2 | 12/2004 | Suehiro |
| 7,948,002 B2 | 5/2011 | Seo |
| 2005/0151231 A1 * | 7/2005 | Yoshida ..................... 257/669 |
| 2005/0168922 A1 * | 8/2005 | Tay et al. .................... 361/679 |
| 2006/0186429 A1 * | 8/2006 | Chew .......................... 257/100 |
| 2008/0283861 A1 * | 11/2008 | Loh et al. .................... 257/98 |
| 2009/0212304 A1 * | 8/2009 | Wang et al. .................. 257/88 |

* cited by examiner

*Primary Examiner* — Jerome Jackson, Jr.
*Assistant Examiner* — Bo Fan

(57) ABSTRACT

A light-emitting device having at least one spacer located at a bottom surface is disclosed. In two other embodiments, an electronic display system and an electronic system having such light-emitting device are disclosed. The light-emitting device comprises a plurality of leads, a light source die, and a body. The body encapsulates a portion of the plurality of leads and the light source die. The body has a least one side surface and a bottom surface. The at least one spacer is located at the bottom surface. In use, the light-emitting device is attached to a top surface of a substrate. The spacer is configured to create an air vent between the bottom surface and the top surface of the substrate when the light-emitting device is attached to, and the spacer is in contact with the substrate.

19 Claims, 7 Drawing Sheets

LIGHT-EMITTING DEVICE WITH A SPACER AT BOTTOM SURFACE

BACKGROUND

Light-emitting diodes (referred to hereinafter as LEDs) represent one of the most popular light-emitting devices today. Due to the small form factor, LEDs are widely used in many electronic systems. One of the applications is in electronic display systems. Electronic display systems are usually large-scale display systems found in stadiums, discotheques, electronic traffic sign displays and infotainment boards along streets. The electronic display systems may be configured to display text, graphics, images or videos containing information or entertainment contents. Most display systems comprise hundreds or thousands of light-emitting devices arranged in a two dimensional plane for example in a matrix. The light-emitting devices in the electronic display system can be a white LED or a tri-color RGB LED. Each light-emitting device may represent a pixel in the display but in some occasions, a group of single colored light-emitting devices may represent one pixel.

In large-scale electronic display systems, the light-emitting devices may not be surface mount type, but through-hole type having a plurality of leads. The substrate is usually a printed circuit board (referred to hereinafter as PCB) having through-holes to accommodate the leads of light-emitting devices. The assembly of such electronic system usually involves inserting the leads of the light-emitting devices into corresponding through-holes, followed by soldering.

An embodiment of such prior art electronic system is shown in FIG. 1. FIG. 1 illustrates a cross-sectional view of a light-emitting device 105 soldered on a substrate 160 of a prior art electronic system 100. The light-emitting device 105 further comprises a plurality of leads 110, a light source die 130, and a body 140 encapsulating the light source die 130 and a portion of the leads 110. A portion of one of the leads 110 may be configured to define a reflector cup 120. The reflector cup 120 may be adapted to hold the light source die 130. The substrate 160 comprises a plurality of through-holes 165, a top surface 161 and a bottom surface 162.

The light-emitting device 105 attached on the top surface 161 by means of inserting the leads 110 of the light-emitting device 105 into the through-holes 165. The leads 110 are inserted into the through-hole 165 from the top surface 161 and a portion of the leads 110 protruded from the bottom surface 162. Soldering is usually done at the bottom surface 162. As shown in FIG. 1, the leads 110 are fixed to the substrate 160 by solder joints 170a and 170b. A complete solder joint 170a covers the entire through-hole 165 and establish reliable electrical connections. However, air may be trapped inside the through-hole 165. During the soldering process, the air inside the through-hole 165 may be heated up due to the thermal expansion. Consequently, the solder joint 170b may become defective having blowhole 195. The blowhole 195 serves as an air escape route when the air in the through-hole 165 goes thermal expansion.

The blowholes 195 may not be desirable. Without proper solder joint 170a, electrical connections may be intermittent. In addition, when the electronic system 100 is placed outdoor, further extreme external conditions such as high temperature and high humidity may stress the electronic system 100 further causing the solder joint 170b to break down. For outdoor uses, the problem become more pertinent as the operating condition may fluctuates substantially. For example, during daytime, the operating temperature may be 140° C. but during nighttime, the temperature may drop below −20° C.

SUMMARY

Generally, a light-emitting device having at least one spacer located at a bottom surface is disclosed. In one embodiment, a light-emitting device comprises a plurality of leads, a light source die, and a body. The body encapsulates a portion of the plurality of leads and the light source die. The body has a least one side surface and a bottom surface. The at least one spacer is located at the bottom surface. When used in an electronic system, the light-emitting device is attached to a top surface of a substrate of the electronic system. The spacer is configured to create an air vent between the bottom surface of the body, and the top surface of the substrate when the light-emitting device is attached to, and the spacer is in contact with the substrate.

In another embodiment, an electronic display system is disclosed. The electronic display system comprises a substrate, a plurality of through-holes located on a top surface of the substrate, and a plurality of light-emitting devices. Each of the light-emitting devices has a light source die and a body. The body has a side surface and a bottom surface. Each of the light-emitting devices has at least one spacer located at the bottom surface. The spacer is configured to create an air vent between the bottom surface of the body, and the top surface of the substrate when the light-emitting device is attached to, and the spacer is in contact with the substrate.

In yet another embodiment, an electronic system is disclosed. The electronic system comprises a substrate, a light-emitting device and at least another electronic component, usually an integrated chip. The substrate has a top surface and a plurality of through-holes located on the substrate. The light-emitting device further comprises a plurality of leads, a body having at least one side surface and a bottom surface, and at least one spacer located at the bottom surface. The light-emitting device is attached to the top surface of the substrate by inserting the plurality of leads into the plurality of through-holes of the substrate such that the spacer is in contact with the top surface of the substrate, creating an air vent thereon between the bottom surface of the body and the top surface of the substrate.

Other aspects and advantages of the present invention will become apparent from the following detailed description, taken in conjunction with the accompanying drawings, illustrated by way of examples.

BRIEF DESCRIPTION OF THE DRAWINGS

Illustrative embodiments by way of examples, not by way of limitation, are illustrated in the drawings. Throughout the description and drawings, similar reference numbers may be used to identify similar elements.

DETAILED DESCRIPTION

Figure 2:
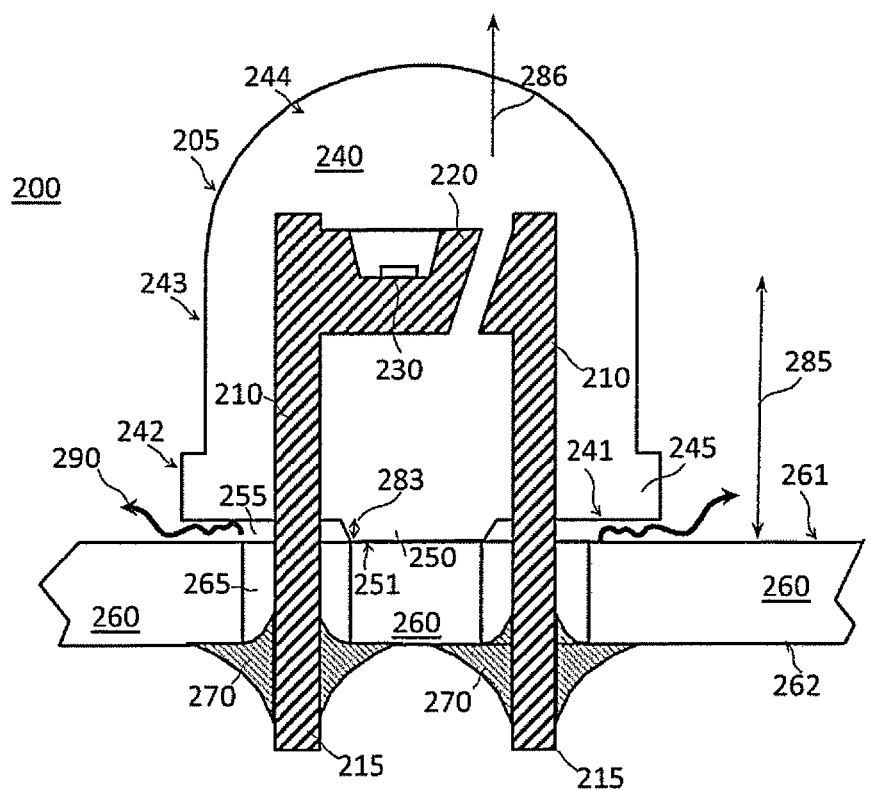
FIG. 2 illustrates a cross-sectional view of an electronic system using a light-emitting device having at least one spacer located on a bottom surface.

FIG. 2 illustrates a cross-sectional view of an electronic system 200. The electronic system 200 comprises a light-emitting device 205, and a substrate 260. The light-emitting device 205 further comprises a plurality of leads 210, a light source die 230, and a body 240 encapsulating the light source die 230 and a portion of the leads 210. A portion of one of the leads 210 may be configured to define a reflector cup 220 adapted to hold the light source die 230. The light source die 230 may be wired bonded to each of the plurality of leads 210. The light source die 230 may be a semiconductor die such as an LED, or any other light source operable to emit light, to including invisible light such as infra red or ultra violet light. The substrate 260 comprises a plurality of through-holes 265, a top surface 261 and a bottom surface 262. The substrate 260 may be a PCB. The top surface 261 and the bottom surface 262 may comprise electrically conductive traces and electrically conductive pad (not shown) adapted to establish electrical connection with the light-emitting device 205.

The plurality of leads 210 may have an elongated portion 215. The body 240 encapsulates part of the elongated portion of the leads 210. The portion of the elongated portion 215 exposed outside the body 240 is usually adapted to be inserted into a through-hole 265 of the substrate 260. The body 240 is usually transparent, or substantially transparent material. In one embodiment, the body 240 may be made from silicone, epoxy, or any other similar material. The body 240 may be formed from a molding or a casting process where the encapsulant is in liquid form or semi-liquid form in the beginning of a manufacturing process. The encapsulant is then inserted into a mold or a jig, encapsulating the light source die 230, the reflector cup 220 and a portion of the leads 210. In a subsequent step, the encapsulant is cured into solid form to form the body 240. In yet another embodiment, the encapsulant may be mixed with a coloring agent.

The body 240 of the light-emitting device 205 comprises a bottom surface 241 and at least one side surface 243. In the embodiment shown in FIG. 2, the light-emitting device 205 further comprises a second side surface 242 as the bottom portion of the body 240 defines a flange 245. The top surface 244 of the body 240 defines a dome shape. The dome shape may be configured to collimate light emitted from the light source die 230. In another embodiment, the light-emitting device 205 defines a rectangular shape and not cylindrical shape as shown in FIG. 2. In such instance, the rectangular shape light-emitting device 205 may define four side surfaces 243 instead of one side surface 243 as shown in FIG. 2. In yet another embodiment, the light-emitting device 205 may not have a flange 245 as shown in FIG. 2 and thus comprises only a single side surface 243. All the variations shall be taken into consideration in the subsequent portion of the specification for the terms "at least one side surface", "a plurality of side surfaces" or "side surface".

The light-emitting device 205 further comprises a spacer 250 located at the bottom surface 241 of the body 240. The embodiment shown in FIG. 2 has a single spacer 250 with a flat bottom surface 251, but in other embodiments, the light-emitting device 205 may have more than one spacer 250. The spacer 250 is configured to distance the bottom surface 241 of body 240 away from the top surface 261 of the substrate 260 when the light-emitting device 205 is attached to the substrate 260. As a result, the spacer 250 is configured to create an air vent 255 between the substrate 260 and the light-emitting device 205.

The spacer 250 may be any geometry that distances the bottom surface 241 of the body 240 away from the top surface 261 of the substrate 260 when the light-emitting device is attached to the substrate. The spacer 261 may be configured to support the light-emitting device 205 on the substrate 260. However, as a matter of design choice, the lead 210 may be configured to provide the support whereas the spacer 250 merely operates to distance the light-emitting device 205 from the substrate 260. The spacer 250 may be protrusions or any geometry protruding from the bottom surface 241 of the body 240 to effectively allow gases formed during the soldering of lead 210 to be vented and thereby avoid blowouts. However, the spacer 250 may be defined by cut-outs, or at least one trench 470 as shown in FIG. 4E.

In FIG. 2, the spacer 250 is a protrusion defining a cone shape but the spacer 250 may be a geometry defining any shapes. The spacer 250 may form a single integral part of the body 240, or alternatively, the spacer 250 may be made separately and glued or attached to the bottom surface 241 of the body 240. Optionally, the spacers 250 may be connected to the substrate 260 through a sharp edge (not shown). Although the spacer 250 shown in FIG. 2 covers a small area of the bottom surface 241, in yet another embodiment, the spacer 250 may cover more than 80% of the bottom surface 241 (See FIG. 4).

The light-emitting device 205 may be supported on the board through the leads 210. Theoretically, one spacer 250 may be sufficient to create the air vent 255 between the substrate 260 and the light-emitting device 205. However, the number of spacers 250 may be a design consideration because in some circumstances, more spacers 250 may be preferred to ensure that the bottom surface 241 of the body 240 is in parallel with the substrate 260. Subsequent embodiments may show a plurality of spacers 250 but it is understood that one spacer 250 may be adequate. All variations such as a single spacer 250 and a plurality of spacers 250 shall be considered in interpreting the term "spacer", "at least one spacer 250", "a plurality of spacers", or other similar spacer related terms.

As shown in FIG. 2, the leads 210 of the light-emitting device 205 are inserted into the through-holes 265 such that the light-emitting device 205 is attached on the top surface 261. The leads 210 are inserted through the through-hole 265. Usually the distance 285 of the light source die 230 relative to the top surface 261 of the substrate 260 may need to be tightly controlled. In order to make the distance 285 consistent, the leads 210 are inserted fully into the through-holes 265 such that the spacer 250 is in contact with the top surface 261. In such circumstance, the bottom surface 241, which usually reflects the horizontal axis (not shown) of the light-emitting device 205, is in parallel to the substrate 260.

In addition, the vertical axis 286 of the light-emitting device 205 is usually perpendicular to the substrate 260. For light-emitting devices 205 having more than one spacer 250, each spacer 250 has a consistent height 283 such that the bottom surface 241 is substantially parallel to the substrate 260. In cases where the light-emitting devices 205 having only one of the spacer 250, the flat bottom surface 251 of the spacer 250 is usually relatively large such that the bottom surface 241 is supported in a parallel position to the substrate 260. Due to process variation, the flat bottom surface 251 of the spacer 250 may not be in parallel with the bottom surface 241 of the body 240. Optionally, the spacer 250 may be slightly elastic and compressible so that the vertical axis of the light-emitting device 205 can be corrected during assembly.

Figure 1:
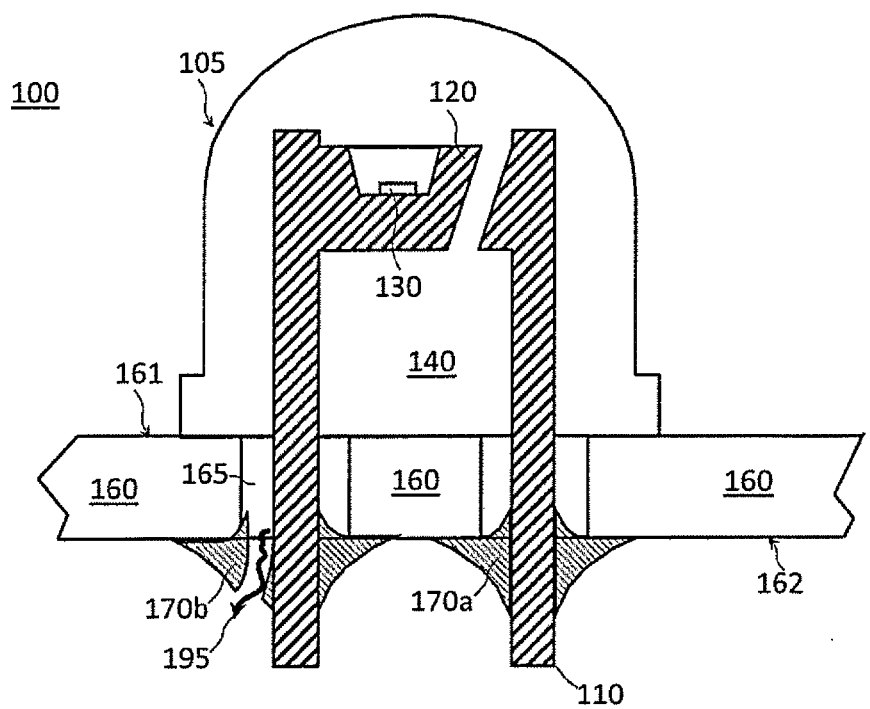
FIG. 1 illustrates a cross-sectional view of a prior art electronic system.

Soldering is usually done at the bottom surface 262 of the substrate 260. As shown in FIG. 2, the leads 210 are fixed to the substrate 260 by solder joints 270. During soldering process, the air trapped inside the through-hole 265 or its surrounding area may escape via the air vent 255 located between the bottom surface 241 of the light-emitting device 205 and the top surface 261 of the substrate 260. As shown in FIG. 2, an air stream 290 may escape through the air vent 255. The air vent 255 may define any shape configurable to allow air trapped inside the through-hole 265 to escape. Consequently, issues seen by the blowhole 195 shown in FIG. 1 may be avoided or reduced.

Figure 3A:
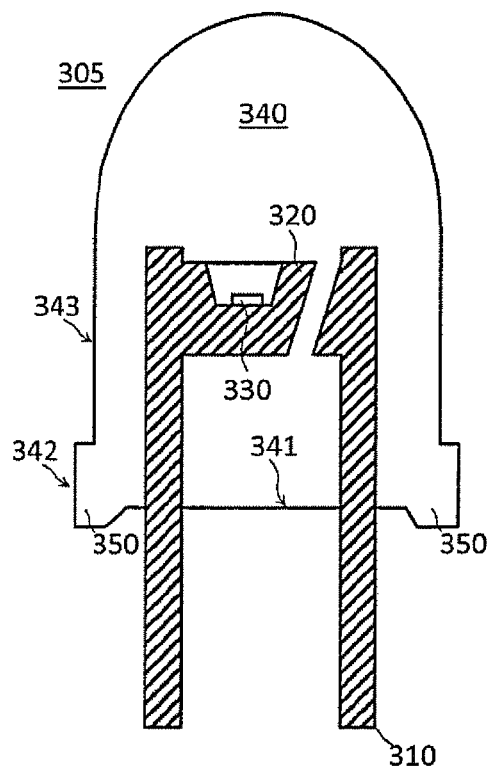
FIG. 3A illustrates a cross-sectional view of a light-emitting device having at least one spacer in contact with a side surface.
Figure 3B:
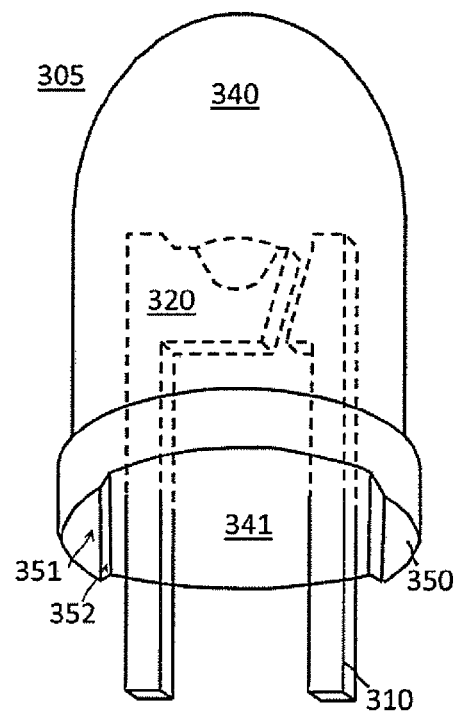
FIG. 3B illustrates a perspective view of the light-emitting device shown in FIG. 3A.
Figure 3C:
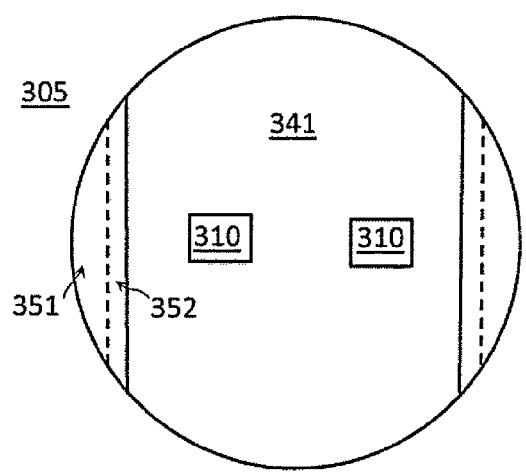
FIG. 3C illustrates a bottom view of the light-emitting device shown in FIG. 3A.

FIG. 3A illustrates a cross-sectional view of a light-emitting device 305. A perspective view of the light-emitting device 305 is shown in FIG. 3B. In FIG. 3C, a bottom view of the light-emitting device 305 is illustrated. The light-emitting device 305 comprises a plurality of leads 310, a reflector cup 320, a light source die 330, and a body 340. The body 340 is an encapsulant encapsulating the reflector cup 320, the light source die 330 and a portion of the leads 310. The body 340 further comprises a bottom surface 341, at least one side surface 343 and optionally 342, and a plurality of spacers 350. The plurality of spacers 350 may be formed at the outer perimeter of the bottom surface 341 and in contact with the at least one side surface 342. The spacer 350 may have a bottom surface 351 and a side surface 352. The light-emitting device 305 is at least different from the light-emitting device 205 shown in FIG. 2 in that the spacer 350 is in contact with the at least one side surface 342 of the body 340. In yet another embodiment, the bottom surface 351 may be minimal such that the bottom surface 351 may define a line, for example, a curve line over a section of the perimeter of the bottom surface 341.

Referring to FIG. 3B, the spacer 350 is defined by the side surface 352, the bottom surface 351, and a portion of the at least one side surface 342 of the body 340. The side surface 342 may be perpendicular to the bottom surface 352. As shown in FIG. 3C, the two spacers 350 are located on opposite sides of the bottom surface 341 of the body 340 in symmetrical locations. In yet another embodiment where the light-emitting device 305 may have four spacers 350 radially and symmetrically located around the center of the bottom surface 341 of the body 340. Although two or four spacers 350 are illustrated, the light-emitting device 350 may have effective number of spacers 350 operable to define an air vent 255 shown in FIG. 2. Similarly, the spacers 350 may not be located in a radially symmetrical location. The spacers 350 may spread out in an inconsistent manner but yet provide enough support to enable the light-emitting device 305 to stand in a vertical position 286 on a substrate 260 (See FIG. 2).

Figure 4A:
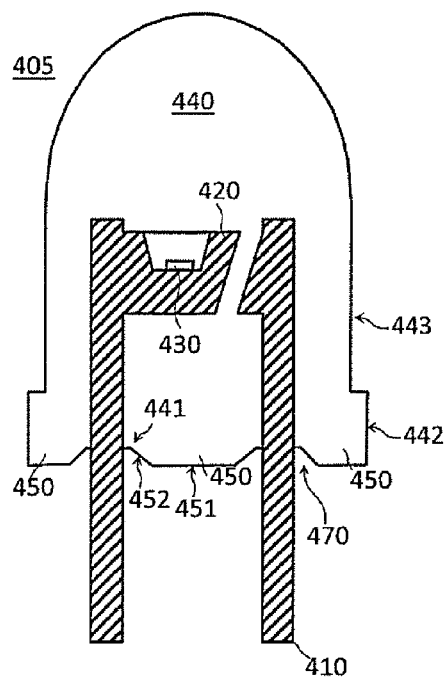
FIG. 4A illustrates a cross-sectional view of a light-emitting device having spacers defined by at least one trench.
Figure 4B:
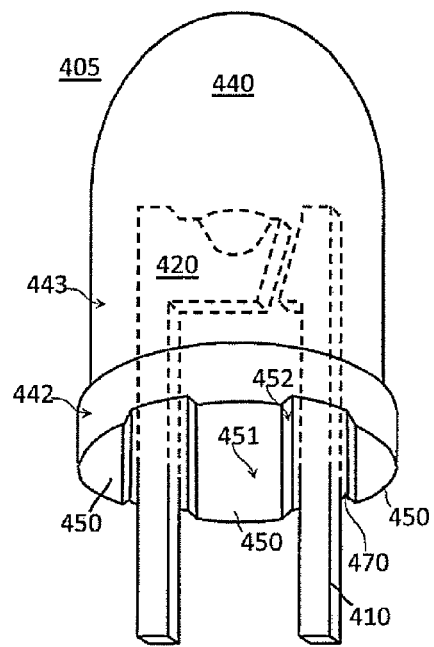
FIG. 4B illustrates a perspective view of the light-emitting device shown in FIG. 4A.
Figure 4C:
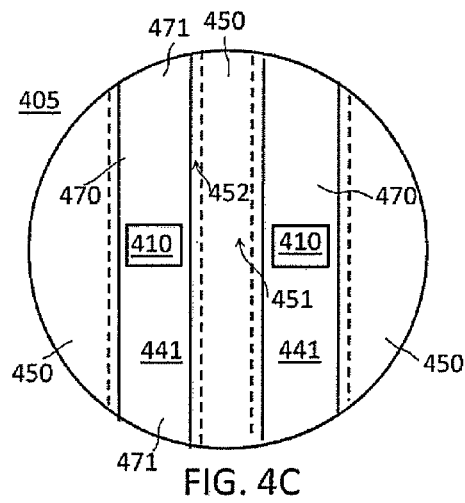
FIG. 4C illustrates a bottom view of the light-emitting device shown in FIG. 4A.
Figure 4D:
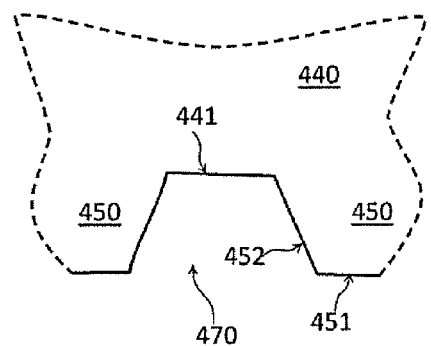
FIG. 4D illustrates a cross-sectional view of a trench of the light-emitting device shown in FIGS. 4A-4C.
Figure 4E:
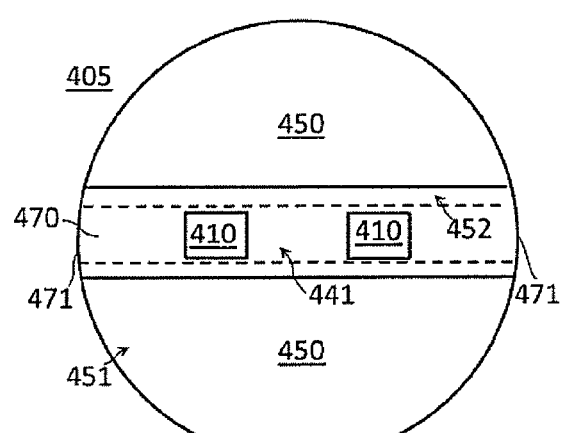
FIG. 4E illustrates a bottom view of an alternative light-emitting device having a trench with both ends connected to the at least one side surface.
Figure 4F:
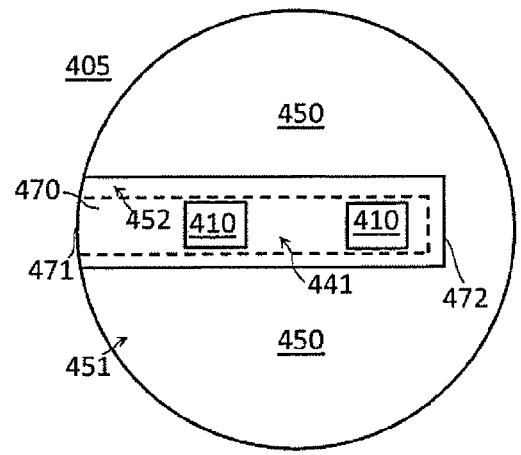
FIG. 4F illustrates a bottom view of an alternative light-emitting device having a trench with one end connected to the at least one side surface.

FIG. 4A illustrates a cross-sectional view of a light-emitting device 405. A perspective view of the light-emitting device 405 is shown in FIG. 4B. In FIG. 4C, a bottom view of the light-emitting device 405 is illustrated. The light-emitting device 405 comprises a plurality of leads 410, a reflector cup 420, a light source die 430, and a body 440. The body 440 may further comprise a bottom surface 441, at least one side surface 443 and optionally 442. The spacer 450 may comprise a side surface 452 and a bottom surface 451. The bottom surface 451 of the spacer 450 is at different height level compared to the bottom surface 441 of the body 440. The bottom surface 451 of the protrusion is usually in parallel with the bottom surface 441 of the body. FIG. 4D illustrates a cutaway cross-sectional view of the trench 470. As shown in FIG. 4D, the bottom surface 441 of the body 440, and two side surfaces 452 of the spacers 450 define the trench 470.

As shown in FIG. 4C, the trench 470 has two ends 471. The trench 470 extends across the light-emitting device 405 with one end 471 in contact with one side of the at least one side surface 442 and another end 471 in contact with opposite side. The trench 470 may be configured to operate as an air vent 255 between the bottom surface 441 of the body 240 and a top surface 265 of a substrate 260 as shown in FIG. 2. Hot air trapped in the trench 470 may travel towards the at least one side surface 442 and escape thereof to the surrounding area (not shown).

In the embodiment shown in FIG. 4C, the spacers 450 are defined by a plurality of trenches 470. Alternatively, the spacers 450 may be defined by a single trench 470. This is shown in an alternative embodiments illustrated in FIGS. 4E and 4F. The alternative bottom view shown in FIG. 4E comprises only one trench 470 having two ends 471. The trench 470 is also in contact with the leads 410. The trench 470 extends across the bottom surface 441 of the body 440. Both ends 471 of the trench 470 is connected to the at least one side surface 442 at two opposite locations. In another alternative design shown in FIG. 4F, one end 471 of the trench 470 is connected to the at least one side surface 442. The other end 472 of the trench 470 terminates in a middle portion and not in contact with the at least one side surface 442. The trench 470 may define any shapes. For example the cross sectional view of the trench 470 may be a 'V shape', 'U shape' or any other similar shape capable to operate as air escape route.

Figure 4G:
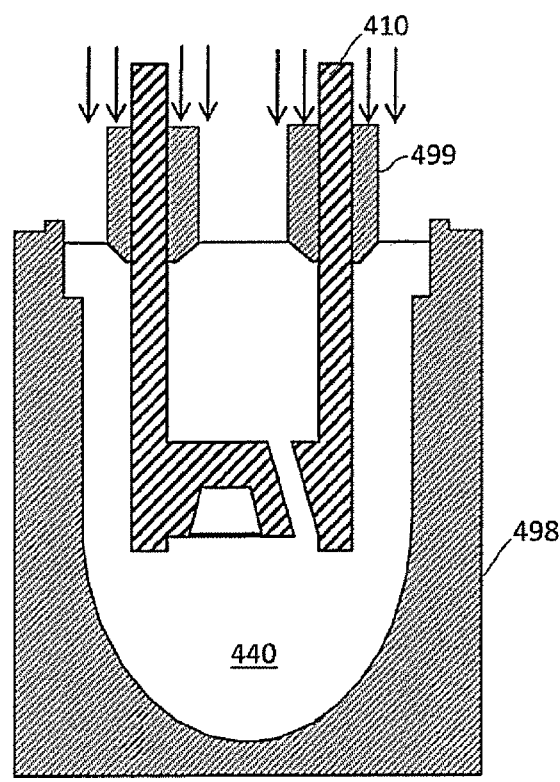
FIG. 4G illustrates how the trench is created during a casting process.

The trench 470 may be manufactured in many different ways such as by sawing or cutting away a portion of the body 440. Alternatively, a bottom mold may be used to mold the trench 470 and the spacers 450. One cost effective way to make the light-emitting device 405 is through casting process shown in FIG. 4G. The body 440 of the light-emitting device 405 may be manufactured through a jig 498. Referring to FIG. 4A and FIG. 4G, an encapsulant in liquid form may be inserted into the jig 498 to encapsulate the light source die 430 and the reflector cup 420 and a portion of the leads 410. The liquid encapsulant is then cured into solid form to form the body 440. A compressor jig 499 may be used to compress the encapsulant during the curing process when the body 440 is in semi-solid form to define the trench 470. This casting process may reduce the cost for manufacturing because the molding tools are not needed.

Figure 5A:
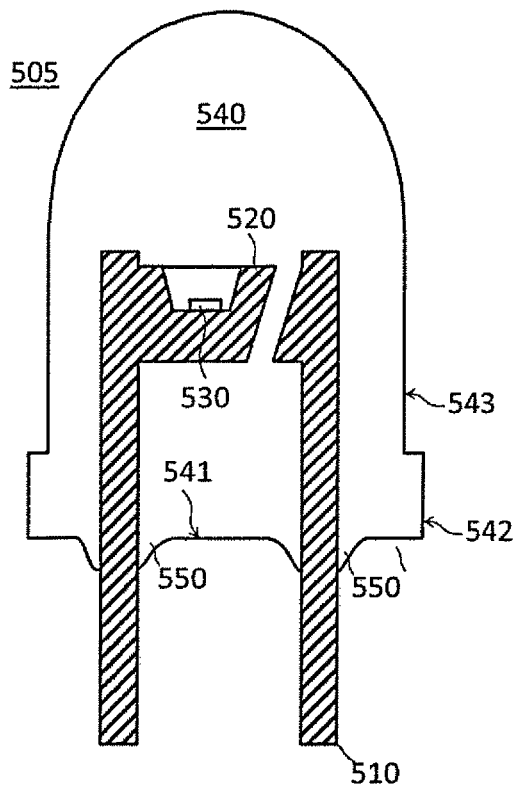
FIG. 5A illustrates a cross-sectional view of a light-emitting device having at least one spacer in contact with a lead.
Figure 5B:
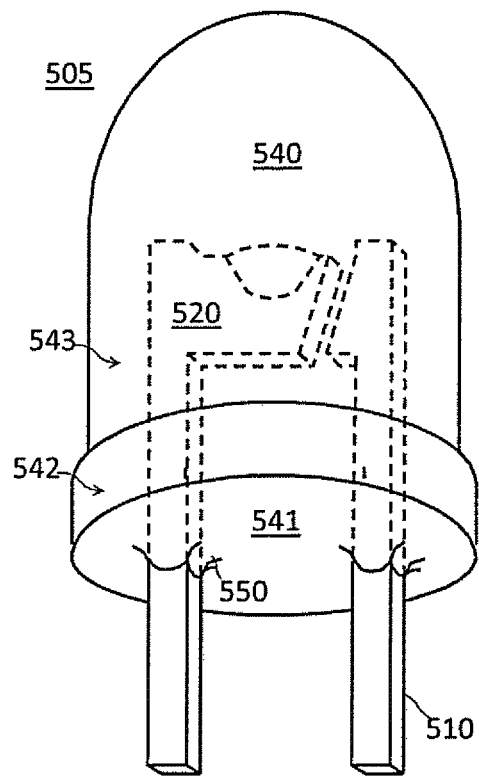
FIG. 5B illustrates a perspective view of the light-emitting device shown in FIG. 5A.
Figure 5C:
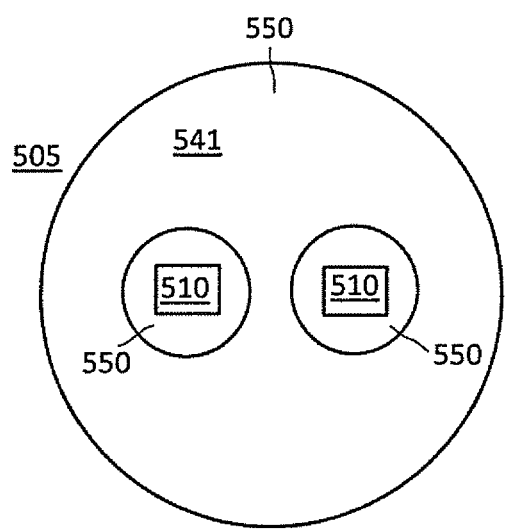
FIG. 5C illustrates a bottom view of the light-emitting device shown in FIG. 5A.

FIG. 5A illustrates a cross-sectional view of yet another light-emitting device 505. A perspective view of the light-emitting device 505 is shown in FIG. 5B. In FIG. 5C, a bottom view of the light-emitting device 505 is illustrated. The light-emitting device 505 comprises a plurality of leads 510, a reflector cup 520, a light source die 530, a body 540 and a plurality of spacer 550. The body 540 may further comprise a bottom surface 541, at least one side surface 543 and optionally 542. The light-emitting device 505 differs from the light-emitting device 305 at least in that the spacers 550 are in contact with the leads 510. In the embodiment shown in FIG. 5B, the spacers 550 may be meniscus caused by capillary effect formed using a controlled process. The meniscus may be configured to define a shape such that when attached to a via-hole 265 shown in FIG. 2, the air trapped inside the via-hole 265 can escape through the air vent 255.

Figure 6A:
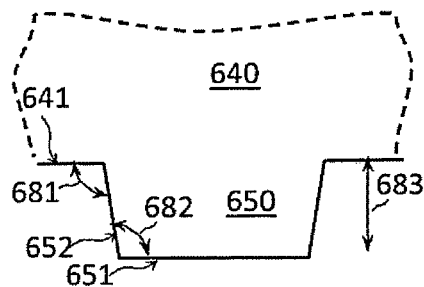
FIG. 6A illustrates a cross-sectional view of a spacer having a flat side surface.
Figure 6B:
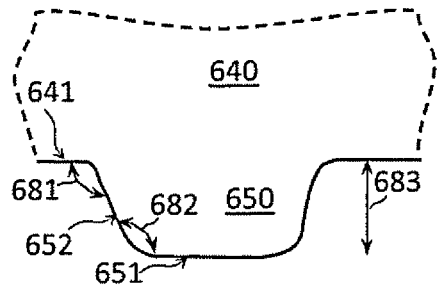
FIG. 6B illustrates a cross-sectional view of a spacer having a curve side surface.

FIG. 6A illustrates a cross-sectional view of a spacer 650 having a bottom surface 651 and a substantially flat side surface 652. As shown in FIG. 6A, the substantially flat side surface 652 forms an angle 681 of at least 90 degrees with the bottom surface 641 of the body 640. Similarly the substantially flat side surface 652 forms an angle 682 of at least 90 degrees with the bottom surface 651 of the spacer 650. The height 683 of the spacer 650 that is made by using capillary effect may be equal to 0.01 mm. In another embodiment, the height 683 of the spacer 650 may be more than 0.01 mm. FIG. 6B illustrates a cross-sectional view of a spacer 650 having a bottom surface 651 and a curved side surface 652. Similar to the spacers 650 shown in FIG. 6A, the angles 681 and 682 are more than 90 degrees respectively. The height 683 of the spacer 650 may be more than 0.01 mm.

Figure 7:
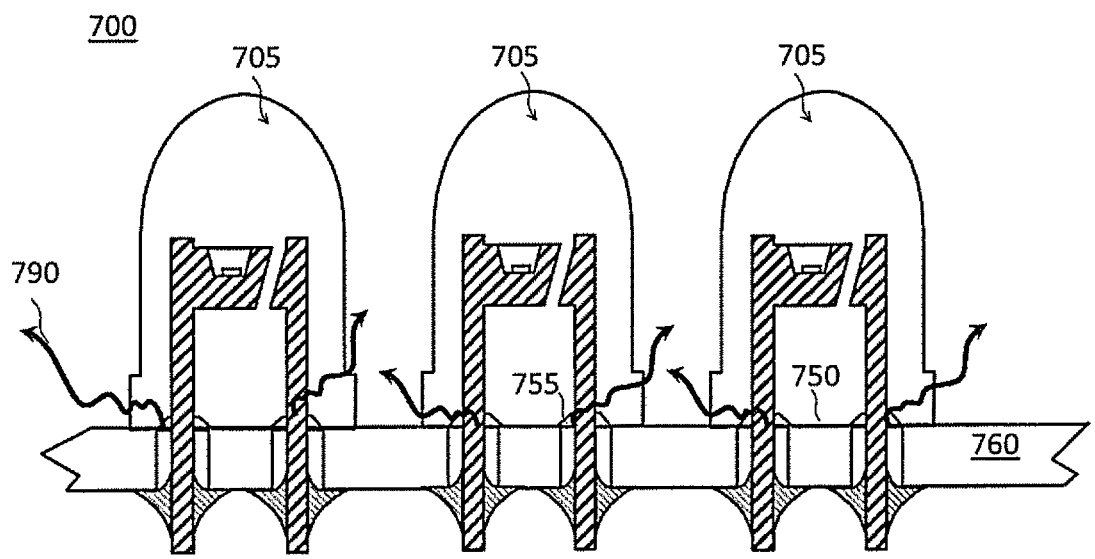
FIG. 7 illustrates a cross-sectional view of an electronic display system.

FIG. 7 illustrates a cut-away cross-sectional view of an electronic display system 700. The electronic display systems 700 may be commonly found in stadiums, discotheques, electronic traffic sign displays and infotainment boards on streets. The electronic infotainment display system 700 comprises a substrate 760 and a plurality of light-emitting devices 705. The light-emitting device 705 may be similar to the light-emitting devices 205, 305, 405 and 505 as shown in FIGS. 2, 3A, 4A and 5A. As illustrated in the embodiment shown in FIG. 7, each of the light-emitting devices 705 has an air vent 755 created by spacers 750 explained earlier in various embodiments. During soldering process, hot air flow 790 may escape through the air vent 755 and the problem of a blowhole 195 shown in FIG. 1 can be avoided.

The light-emitting devices 705 are arranged in a two dimensional place, preferably arranged in an array having multiple columns and rows. Each of the light-emitting devices 705 may represent a pixel of the electronic display system 700. For a color display system, the light-emitting devices 705 may have at least three light source dies 230 shown in FIG. 2. Each light source die 230 may be capable of emitting red, green or blue light, respectively. Alternatively, three neighboring light-emitting devices 705, each capable of emitting a single color may collectively represent a pixel.

Figure 8:
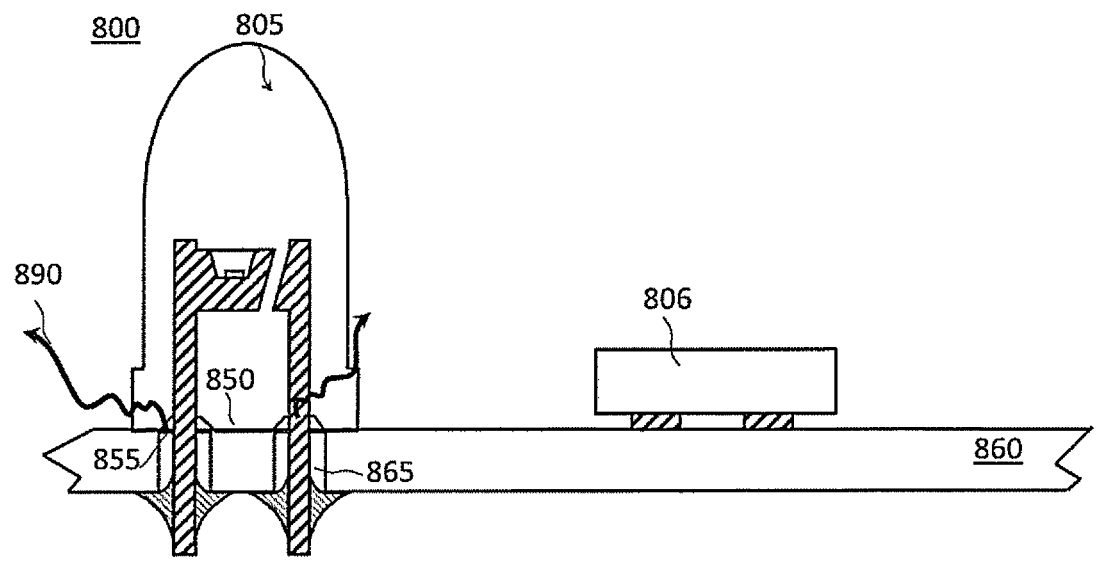
FIG. 8 illustrates a cross-sectional view of an electronic system.

FIG. 8 illustrates a cut-away cross-sectional view of an electronic system 800. The electronic system 800 may comprise a substrate 860 having a plurality of through-holes 865, one or more light-emitting devices 805, and one or more packaged integrated chips 806. The integrated chips 806 may be drivers, processors, logic circuitry or another other similar electronic components. Usually the one or more light-emitting device 805 may operate as indicator light configured to provide feedback to a user. The electronic system 800 may be found in many electronic devices such as motherboards of computers, control circuit boards of microwave ovens, washing machines, sound audio systems, or any other similar electronic devices. The integrated chips 806 may be connected electrically to the light-emitting device 805 through conductors located on the substrate 860. The light-emitting device 805 may be similar to the light-emitting devices 205, 305, 405 and 505 as shown in FIGS. 2, 3A, 4A and 5A. As illustrated in the embodiment shown in FIG. 8, the light-emitting device 805 comprises an air vent 855 created by spacers 850 explained earlier in various embodiments. During soldering process, hot air flow 890 may escape through the air vent 855.

Although specific embodiments of the invention have been described and illustrated herein above, the invention should not be limited to any specific forms or arrangements of parts so described and illustrated. For example, light source die described above may be LEDs die or some other future light source die. Likewise, although an elongated trench is discussed, the trench 470 illustrated in FIG. 4 may include air passage having another shape as known or later developed without departing from the spirit of the invention. Although the interpretation on the terms "protrusions" and "side surfaces" to include all other variations have been explained explicitly, similar interpretation to include all variations should also be used for other terms not explicitly mentioned. For clarity purpose, orientation terms such as "top", "bottom", "side" are used to aid understanding of the specification. However, these terms should not be limited to the orientation illustrated. The scope of the invention is to be defined by the claims appended hereto and their equivalents. Similarly, manufacturing embodiments and the steps thereof may be altered, combined, reordered, or other such modification as is known in the art to produce the results illustrated.

What is claimed is:

1. A light-emitting device, comprising:
a plurality of leads;
a light source die attached on one of the plurality of leads;
a body of encapsulant material having at least one side surface and a bottom surface encapsulating the light source die;
an outer perimeter of the body encapsulating a portion of the plurality of leads;
at least two of the plurality of leads having elongated portions that protrude from the bottom surface outside the body respectively;
at least one encapsulant protrusion of encapsulant material extending from the bottom surface of the body; and
an air vent defined at least in part by the encapsulant protrusion, the air vent extending outwardly from the at least two of the plurality of leads through the outer perimeter of the body, so as to exhaust air outwardly from the body,
wherein the at least one encapsulant protrusion is compressible and substantially shorter compared to the elongated portions of the at least two of the plurality of leads that protrude from the bottom surface;
and wherein the body comprises at least one trench located at the bottom surface of the body and wherein the at least one trench extends outwardly through the outer perimeter.

2. The light-emitting device of claim 1, wherein the at least one encapsulant protrusion protrudes in parallel to but distanced away from the elongated portions of the at least two of the plurality of leads that protrude from the bottom surface.

3. The light-emitting device of claim 1, wherein the at least one encapsulant protrusion is in direct contact with a portion of the outer perimeter of the body.

4. The light-emitting device of claim 1, wherein the at least one encapsulant protrusion encapsulates a portion of the at least two of the plurality of leads.

5. The light-emitting device of claim 1, wherein the at least one encapsulant protrusion has a flat side surface and a bottom surface, and wherein the bottom surface of the at least one encapsulant protrusion forms an angle of at least 90 degrees with the side surface of the at least one encapsulant protrusion.

6. The light-emitting device of claim 1, wherein the at least one encapsulant protrusion has a curved side surface.

7. The light-emitting device of claim 1, wherein the at least one trench has two ends directly connected to the at least one side surface of the body.

8. The light-emitting device of claim 1, wherein the at least one encapsulant protrusion has a height greater than or equal to 0.01 mm.

9. The light-emitting device of claim 1, wherein the at least one encapsulant protrusion covers more than 80% of the bottom surface of the encapsulant body.

10. The light-emitting device of claim 1, wherein the light-emitting device forms a portion of an electronic display system.

11. An electronic display system, comprising: a substrate, the substrate having a top surface; a plurality of through-holes located on the substrate; a plurality of light-emitting devices attached on the top surface of the substrate; wherein each of the plurality of light-emitting devices further comprises a light source die, a plurality of leads, and an encapsulant body of encapsulant material; wherein the encapsulant body comprises at least one side surface, a bottom surface, and at least one spacer of the encapsulant material defining the body; wherein the bottom surface of the encapsulant body comprises an outer perimeter; wherein the encapsulant body comprises at least one trench located at the bottom surface of the encapsulant body and wherein the at least one trench extends outwardly through the outer perimeter; wherein two of the plurality of leads having elongated portions protruding from the bottom surface of the encapsulant body respectively; wherein the at least one spacer is substantially shorter compared to the elongated portions of the at least two of the plurality of leads that protrude from the bottom surface; wherein each of the plurality of light-emitting devices is attached to the top surface of the substrate by inserting the plurality of leads into the plurality of through-holes such that the at least one spacer is in contact with the top surface of the substrate, creating an air vent between the bottom surface of the plurality of light-emitting device and the top surface of the substrate; and wherein the air vent extends from the at least two of the plurality of leads and is configured to exhaust air outwardly from the encapsulant body.

12. The electronic display system of claim 11, wherein the at least one spacer protrudes in parallel to but distanced away from the at least two of the plurality of leads that protrude from the bottom surface of the encapsulant body.

13. The electronic display system of claim 11, wherein the at least one spacer is in direct contact with the at least one side surface of the encapsulant body.

14. An electronic system, comprising:
a substrate, the substrate having a top surface; a plurality of through-holes located on the substrate; a light-emitting device attached on the substrate, the light-emitting device having a plurality of leads, an encapsulant body of an encapsulant material, and a die encapsulated by the encapsulant body; wherein the encapsulant body of the light-emitting device further comprises at least one spacer, at least a side surface and a bottom surface; wherein the at least one spacer is a protrusion of the encapsulant body protruding from the bottom surface of the encapsulant body but distanced away from the plurality of leads; wherein the encapsulant body has an outer perimeter; wherein the encapsulant body comprises at least one trench located at the bottom surface of the encapsulant body;
wherein the at least one trench is formed surrounding the at least one spacer such that the at least one trench extends outwardly through the entire outer perimeter;
wherein the light-emitting device is attached to the top surface of the substrate by inserting the plurality of leads into the plurality of through-holes such that the at least one spacer is in contact with the top surface of the substrate, creating an air vent between the bottom surface of the encapsulant body and the top surface of the substrate;
wherein the air vent extends between the plurality of leads and the outer perimeter of the encapsulant body; and wherein air may be trapped inside the plurality of through-holes and the air vent is configured to release the trapped air outwardly from the body.

15. The light-emitting device of claim 1, wherein the at least one encapsulant protrusion is tapered such that the at least one encapsulant protrusion becomes narrower extending away from the bottom surface of the body of encapsulant material.

16. The electronic display system of claim 11, wherein the at least one spacer is tapered such that the at least one spacer becomes narrower extending away from the bottom surface of the encapsulant body.

17. The light-emitting device of claim 1, wherein the at least one encapsulant protrusion is distanced away from the plurality of leads and the outer perimeter.

18. The electronic display system of claim 11, wherein the at least one spacer is distanced away from the plurality of leads and the outer perimeter.

19. The electronic display system of claim 11, wherein the at least one spacer is compressible.

* * * * *